United States Patent
Katou

(10) Patent No.: US 7,400,168 B2
(45) Date of Patent: Jul. 15, 2008

(54) SEMICONDUCTOR DEVICE WITH LEVEL CONVERSION CIRCUIT

(75) Inventor: Hiromu Katou, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 169 days.

(21) Appl. No.: 11/395,285

(22) Filed: Apr. 3, 2006

(65) Prior Publication Data

US 2006/0220696 A1    Oct. 5, 2006

(30) Foreign Application Priority Data

Apr. 4, 2005    (JP)    ............... 2005-107613

(51) Int. Cl.
H03K 19/094    (2006.01)
H03K 19/0175    (2006.01)

(52) U.S. Cl. ............... 326/68; 326/86; 327/333

(58) Field of Classification Search ............. 326/63, 326/68, 83, 86; 327/108, 333
See application file for complete search history.

(56) References Cited

U.S. PATENT DOCUMENTS

2001/0033186 A1*  10/2001  Green ................. 327/65
2005/0134314 A1*   6/2005  Prather et al. ......... 326/86

FOREIGN PATENT DOCUMENTS

JP    2000-305528    11/2000

* cited by examiner

*Primary Examiner*—Daniel D Chang
(74) *Attorney, Agent, or Firm*—McGinn IP Law Group, PLLC

(57) ABSTRACT

A level conversion circuit includes a differential pair of first and second transistors receiving differential input signals; a current mirror section; and a CMOS-type latch circuit. The current mirror section includes a first current mirror circuit receiving output current from the first transistor to output a first mirror current; a second current mirror circuit receiving output current of the second transistor to output a second mirror current; a third current mirror circuit receiving the second mirror current to output a third mirror current to a first output terminal of differential output terminals; and a fourth current mirror circuit receiving the first mirror current to output a fourth mirror current to a second output terminal of the differential output terminals.

17 Claims, 16 Drawing Sheets differential interface can transfer a signal of the small amplitude, it is suitable to transfer the signal at high speed.

When a signal transferred from the differential interface is converted into a level suitable for the single end interface, in other words, when a logic level of the transferred signal is converted into a different logic level, a duty ratio of the logic level is sometimes deteriorated or changed after the conversion. As a technique to suppress the deterioration of the duty ratio, a technique in which a phase adjustment circuit is provided in the post stage of a level conversion circuit is known as described in Japanese Laid Open Patent Publication (JP-P2000-305528A).

FIG. 1 shows a configuration of a conventional technique according to Japanese Laid Open Patent Publication (JP-P2000-305528A). A conventional level conversion circuit includes two level shifters (LVL) 101 and 103, two inverters 102 and 104 and a phase adjustment circuit 105. The two level shifters (LVL) 101 and 103 convert two-phase clock signals CK and CKX having opposite phases of 5V into two-phase clock signals in the same cycle of 15V. The two inverters 102 and 104 invert the phases of output clock signals from the two level shifters 101 and 103. The phase adjustment circuit 105 adjusts the output clock phases of the two inverters 102 and 104. In the level conversion circuit having the above configuration, the two-phase clock signals CK and CKX having the mutually opposite phases are supplied to input terminals a and b of the level shifter 101, and to input terminals b and a of the level shifter 103. In other words, the level shifters 101 and 103 receive the two-phase clock signals CK and CKX in the opposite phases. The level shifters 101 and 103 have circuit configurations that are practically equivalent to each other, and output single-phase clock signals in the opposite phases. In FIG. 1, the phase adjustment circuit 105 includes a latch circuit 106, in which inverters 107 and 109 invert output clock phases from the inverters 102 and 104, inverters 111 and 112 connected in parallel in the mutually opposite directions to latch respective output clocks of the inverters 107 and 109, and inverters 108 and 110 invert two output clock phases of the latch circuit 106 to output two-phase clocks CK and CKX in the mutually opposite phases.

In the above conventional technique, a positive phase differential signal is supplied to one of the two level shifters and an opposite phase differential signal is supplied to the other level shifter. Accordingly, the two level shifters are required. The inverters are provided between the phase adjustment circuit and the level shifters to avoid the effect of the phase adjustment circuit to the level shifters. The phase adjustment circuit includes two inverters for phase adjustment. Thus, the conventional technique requires at least four inverters.

The phase adjustment circuit generates a desired signal by interpolate output phases of the inverters provided in the post stage of the level shifters. However, it is difficult to apply the technique disclosed in Japanese Laid Open Patent Publication (JP-P2000-305528A) to conversion of the logic level in small amplitude such as the CML level to the CMOS level as demanded in a semiconductor device. Also, an appropriate level conversion circuit in a small circuit scale is demanded for a logic level conversion of a small amplitude signal to a different logic level.

SEMICONDUCTOR DEVICE WITH LEVEL CONVERSION CIRCUIT

BACKGROUND OF THE INVENTION

1. Field of the Invention

The present invention relates to a level conversion circuit.

2. Description of the Related Art

In recent years, a semiconductor device is configured of a plurality of logic circuits to carry out complicated processing appropriately. The logic circuits in the semiconductor device include a TTL (Transistor Transistor Logic) circuit and a CMOS logic circuit or the like. Connection of the logic circuits is provided through interfaces inside the semiconductor device, and the interfaces such as a TTL interface and a CMOS interface corresponding to the logic circuits are employed as the interfaces in the semiconductor device.

An operation speed of the semiconductor circuit has increased in conjunction with the development of a semiconductor technology. A data transfer rate has been accelerated to an order of Gbps in the past few years. A higher data transfer rate technique between devices is demanded to cope with the accelerated operation speed of the semiconductor device. Since the above conventional interfaces such as the TTL interface and the CMOS interface require a relatively large amplitude level, data transfer cannot be carried out at an appropriate rate in case of the frequency of a bus clock signal of 100 MHz or more. Therefore, a differential interface such as LVDS (Low Voltage Differential Signaling) is essential to the above Gbps order data transfer. In a data communication using the differential data transfer, a conversion circuit is provided between the TTL circuit and the CMOS logic circuit which are provided for blocks, and a differential data transfer circuit is provided in another block. Integration of these circuits in one chip is available due to the progress of semiconductor technology in recent years. Thus, various merits are realized such as low-cost manufacture of a high-speed data transfer device and reduction of a substrate chip area. Accordingly, the above usual logic circuit and the differential data transfer circuit are often mixed in the semiconductor device.

The usual logic circuit employs a one-wire system (hereinafter, to be referred to as a single end interface) to transfer a signal by using a single line except for a ground. On the other hand, the differential transmission circuit such as a CML (Current Mode Logic) used for a signal data transfer of an Ethernet (registered trademark), and a PECL/LVPECL that is widely used in a high-speed clock supply circuit, employs a two-wire system to transfer a signal by using two lines (hereinafter, to be referred to as a differential interface).

The single end interface to transfer a signal by using one line requires a ground line in addition to a signal line necessarily. In the usual logic circuit, a transferred signal is determined to be an H level if the transferred signal is higher than a predetermined voltage, and to be an L level if the transferred signal is lower than the predetermined voltage. The predetermined voltage is called a threshold voltage. The TTL or CMOS uses a ground potential level as a voltage reference. In the single end interface, the signal level is determined to be as the H level or the L level, by using a potential difference between the ground level and the signal line.

On the other hand, the differential interface requires two signal lines to transfer one signal. The logic "1" or "0" is determined based on whether the potential difference between the two signal lines is positive or negative. Therefore, in the differential interface can transfer a signal even if an amplitude level of the transferred signal is small. Since the

SUMMARY OF THE INVENTION

In an aspect of the present invention, a level conversion circuit includes a differential pair transistors configured to receive differential input signals; a current mirror section connected to outputs of the differential pair transistors and configured to output mirror currents to differential output terminals; and first and second inverters cross-coupled to each other between the differential output terminals.

Here, the differential pair transistors may have first and second transistors. The current mirror section may include a first current mirror circuit configured to receive output current from the first transistor to output a first mirror current as one of the mirror currents; a second current mirror circuit configured to receive output current of the second transistor to output a second mirror current as another of the mirror currents; a third current mirror circuit configured to receive the second mirror current to output a third mirror current to a first output terminal of the differential output terminals; and a fourth current mirror circuit configured to receive the first mirror current to output a fourth mirror current to a second output terminal of the differential output terminals.

Also, the first current mirror circuit may output a fifth mirror current to the first output terminal, and the second current mirror circuit may output a sixth mirror current to the second output terminal.

Also, the level conversion circuit may further include a fifth current mirror circuit configured to receive a constant current to output a seventh mirror current to the first output terminal, and a sixth current mirror circuit configured to receive a constant current to output an eighth mirror current to the second output terminal.

Also, the first transistor may receive a non-inversion input signal, and the second transistor may receive an inversion input signal, and the non-inversion output signal may be outputted from the first output terminal and an inversion output signal may be outputted from the second output terminal.

Also, the differential pair transistors, and the third and fourth current mirror circuits may include NMOS transistors, and the first and second current mirror circuits may include PMOS transistors.

Also, the differential pair transistors, and the third and fourth current mirror circuits may include PMOS transistors, and the first and second current mirror circuits may include NMOS transistors.

Also, the differential pair transistors, and the third and fourth current mirror circuits may include NMOS transistors, and the first, second, fifth and sixth current mirror circuits may include NMOS transistors.

Also, the differential pair transistors, and the third and fourth current mirror circuits may include NMOS transistors, and the first, second, fifth and sixth current mirror circuits may include PMOS transistors.

Also, the inverter may be a first CMOS inverter having an input terminal connected with the first output terminal and an output terminal connected with the second output terminal; and a second inverter may be a second CMOS inverter having an input terminal connected with the second output terminal and an output terminal connected with the first output terminal.

Also, the first inverter may be a first CMOS NAND circuit having an input terminal connected with the first output terminal and an output terminal connected with the second output terminal; and the second inverter may be a second CMOS NAND circuit having an input terminal connected with the second output terminal and an output terminal connected with the first output terminal.

Also, the first inverter may be a first CMOS clocked inverter having an input terminal connected with the first output terminal and an output terminal connected with the second output terminal, and the second inverter may be a second CMOS clocked inverter having an input terminal connected with the second output terminal and an output terminal connected with the first output terminal.

Also, a power supply to which sources of transistors of the first and second current mirror circuits are connected may supply a voltage different from a voltage supplied from a power supply to which sources of transistors of the fifth and sixth current mirror circuits.

DESCRIPTION OF THE PREFERRED EMBODIMENTS

Hereinafter, a level conversion circuit of the present invention will be described in detail with reference to the attached drawings.

First Embodiment

Figure 1:
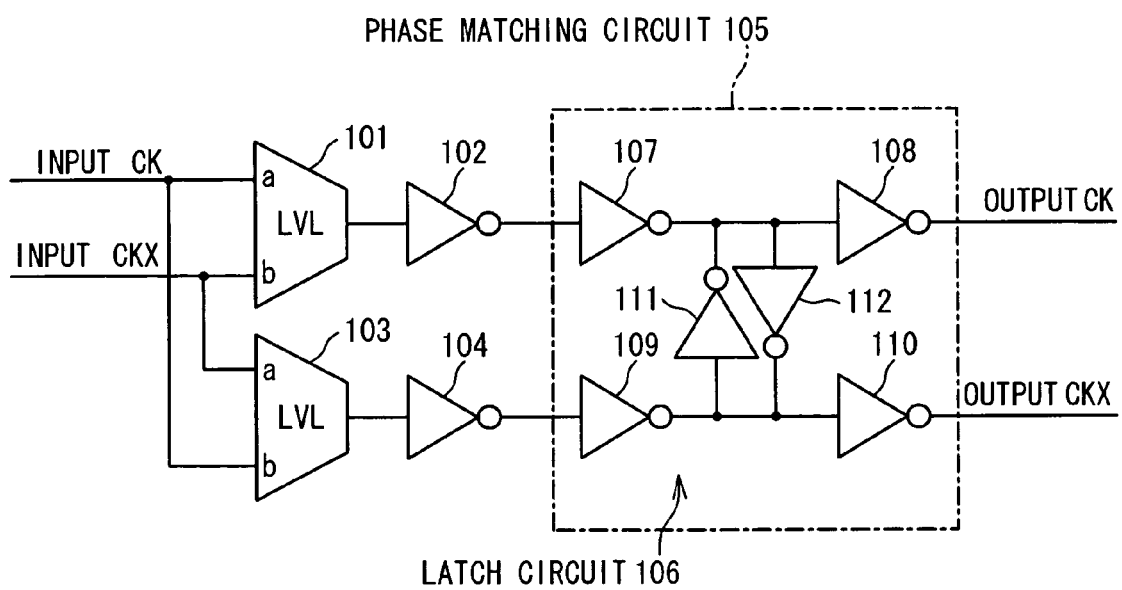
FIG. 1 is a circuit diagram showing a configuration of a conventional level conversion circuit.
Figure 2:
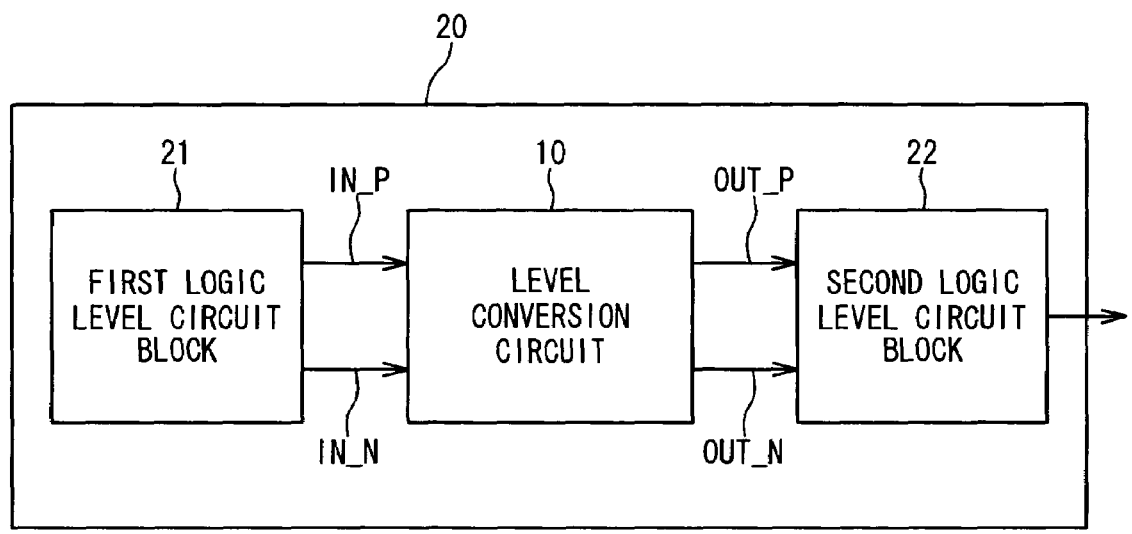
FIG. 2 is a block diagram showing a configuration of a semiconductor device with a level conversion circuit of the present invention.

FIG. 2 is a block diagram showing the configuration of a semiconductor device with the level conversion circuit according to the first embodiment of the present invention. Referring to FIG. 2, the semiconductor device 20 includes a first logic level circuit block 21, a second logic level circuit block 22, and a level conversion circuit 10 for converting the logic level of a signal from the first logic level circuit block 21 to the logic level of the second logic level circuit block 22. It is assumed in the following description that the first logic level circuit block 21 is a circuit block to transfer a signal by using a differential interface, and includes a circuit operating in a CML (Current Mode Logic) level. Also, it is assumed that the second logic level circuit block 22 is a circuit block to transfer a signal by using the differential interface, and includes a circuit operating in the CMOS (Complementary MOS) level. Therefore, the following description is given under the presumption that the level conversion circuit 10 is a circuit to convert the CML Level of a signal to the CMOS level. In the first embodiment, the level conversion carried out in the level conversion circuit 10 is not restricted to the conversion from the CML level to the CMOS level. The level conversion circuit 10 according to the first embodiment is applicable even when the logic level is different between the first logic level circuit block 21 and the second logic level circuit block 22, and effective especially in converting a small amplitude signal to another large amplitude signal.

As shown in FIG. 2, the level conversion circuit 10 converts logic levels of differential input signals (IN_P and IN_N) outputted from the first logic level circuit block 21 to generate output signals (OUT_P and OUT_N) that are supplied to the second logic level circuit block 22. The second logic level circuit block 22 specifies logic levels of the signals as an H level or an L level from the output signals (OUT_P and OUT_N) supplied from the level conversion circuit 10 and based on a threshold voltage corresponding to the second logic level circuit block 22.

Figure 3:
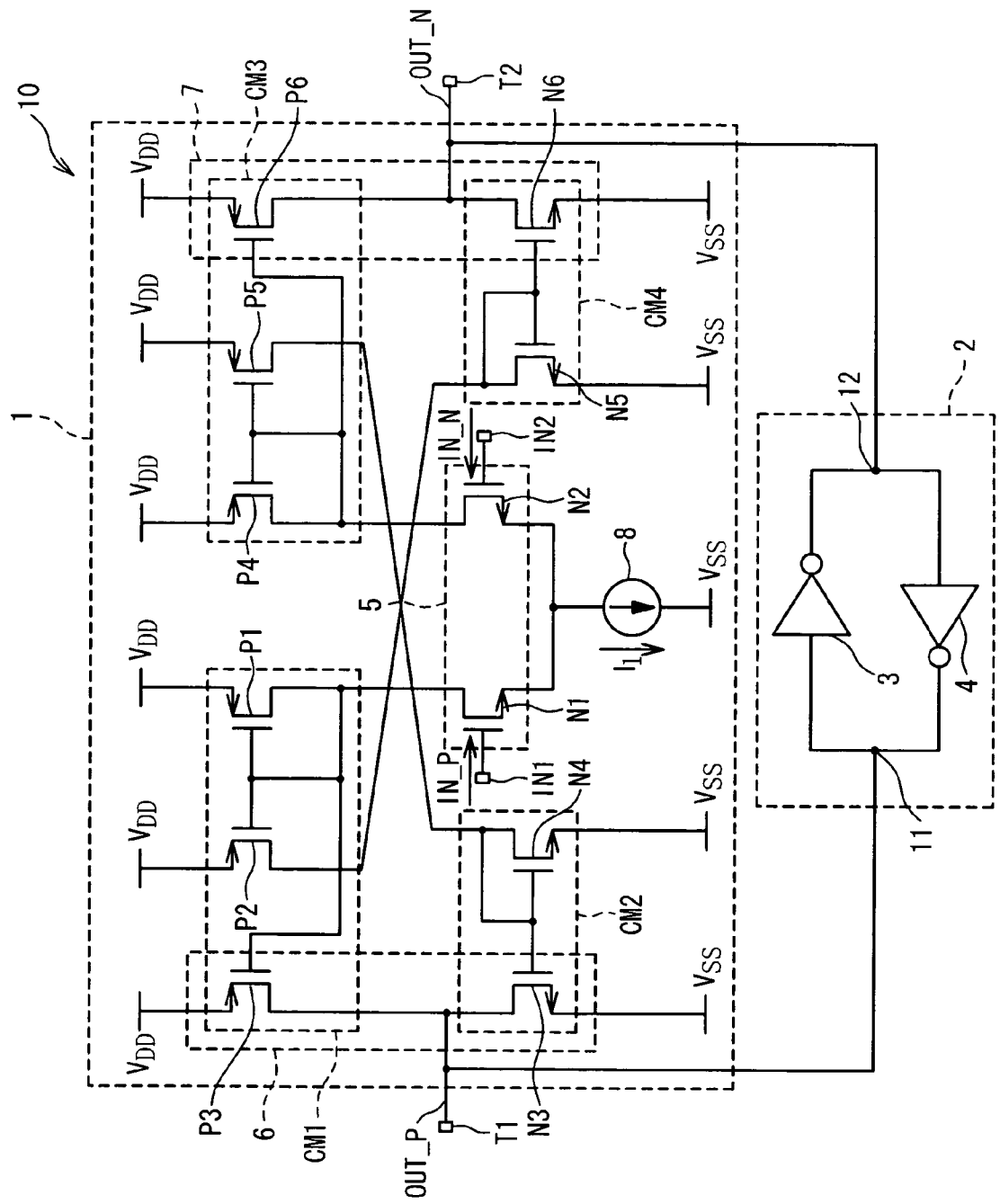
FIG. 3 is a circuit diagram showing the configuration of the level conversion circuit according to a first embodiment of the present invention.

FIG. 3 is a circuit diagram showing the configuration of the level conversion circuit 10 according to the first embodiment of the present invention. Referring to FIG. 3, the level conversion circuit 10 in the first embodiment includes a level converting section 1 and a phase interpolation circuit 2. The level converting section 1 includes an input stage 5 for receiving differential input signals (IN_P and IN_N), a plurality of current mirror circuits (CM1 to CM4), a first output stage 6 and a second output stage 7 for generating output signals (OUT_P and OUT_N), and a constant current source 8. Also, the phase interpolation circuit 2 includes a first inverter 3 and a second inverter 4. An output end of the first inverter 3 is connected to an input end of the second inverter 4 through a second node 12. Similarly, an output end of the second inverter 4 is connected to the first inverter 3 through a first node 11. In FIG. 3, the output end of the second inverter 4 is connected to a first output terminal T1 through the first node 11. Similarly, the output end of the first inverter 3 is connected to a second output terminal T2 through the second node 12. Also, the constant current source 8 is connected between the input stage 5 and a second power source line $V_{SS}$.

As shown in FIG. 3, the input stage 5 of the level converting section 1 includes a first N channel MOS transistor (hereinafter, to be referred to as an NMOS transistor) N1 for receiving the first differential input signal IN_P through a first input terminal IN1, and a second NMOS transistor N2 for receiving the second differential input signal IN_N through a second input terminal IN2. The first current mirror circuit CM1 includes a first P channel MOS transistor (hereinafter, to be referred to as a PMOS transistor) P1, a second PMOS transistor P2 and a third PMOS transistor P3. A drain of the first PMOS transistor P1 is connected to a drain of the first NMOS transistor N1. The respective gates of the first PMOS transistor P1, second PMOS transistor P2 and third PMOS transistor P3 are mutually connected. The gates are connected to the drain of the first PMOS transistor P1.

As shown in FIG. 3, the second current mirror circuit CM2 of the level converting section 1 includes a third NMOS transistor N3 and a forth NMOS transistor N4. Gates of the third NMOS transistor N3 and the forth NMOS transistor N4 are mutually connected, and a drain of the forth NMOS transistor N4 is connected to their gates. The drain of the third PMOS transistor P3 is connected to a drain of the third NMOS transistor N3 to configure the first output stage 6.

Also, as shown in FIG. 3, the third current mirror circuit CM3 includes a forth PMOS transistor P4, a fifth PMOS transistor P5 and a sixth PMOS transistor P6. A drain of the forth PMOS transistor P4 is connected to a drain of the second NMOS transistor N2. The respective gates of the forth PMOS transistor P4, fifth PMOS transistor P5 and sixth PMOS transistor P6 are mutually connected, and the gates are connected to the drain of the forth PMOS transistor P4. The fourth current mirror circuit CM4 includes a fifth NMOS transistor N5 and a sixth NMOS transistor N6. The gates of the fifth NMOS transistor N5 and sixth NMOS transistor N6 are mutually connected, and the gates are connected to a drain of the fifth NMOS transistor N5. The drain of the fifth NMOS transistor N5 is connected to a drain of the second PMOS transistor P2 of the first current mirror circuit CM1. Similarly, the drain of the forth NMOS transistor N4 of the second current mirror circuit CM2 is connected to a drain of the fifth PMOS transistor P5 of the third current mirror circuit CM3. A drain of the sixth PMOS transistor P6 is connected to a drain of the sixth NMOS transistor N6 to configure the second output stage 7.

Figure 4:
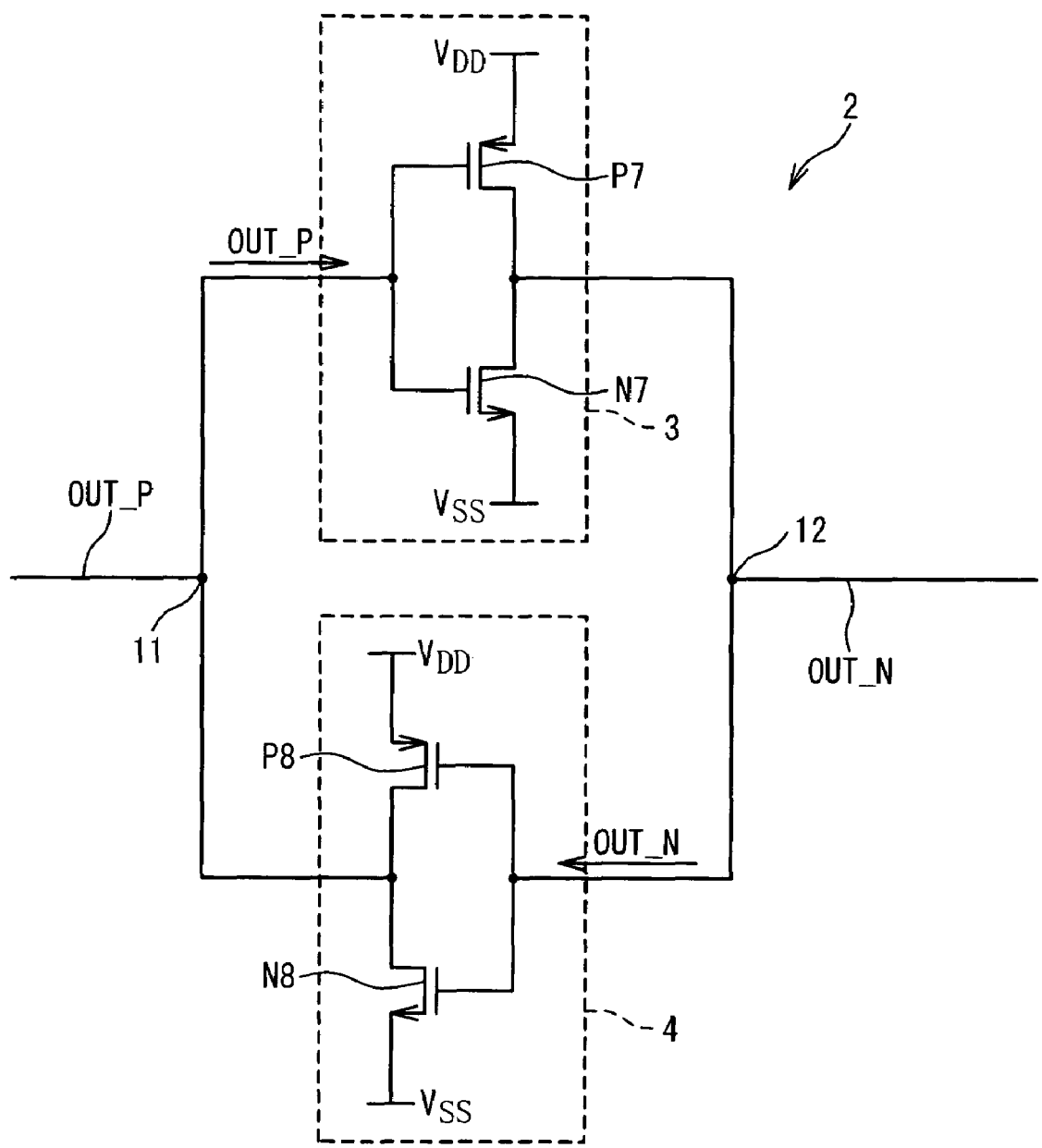
FIG. 4 is a circuit diagram showing the configuration of a phase interpolation circuit in the first embodiment.

FIG. 4 shows the configuration of the phase interpolation circuit 2 in the first embodiment. As shown in FIG. 4, the first inverter 3 of the phase interpolation circuit 2 includes a seventh PMOS transistor P7 and a seventh NMOS transistor N7 to configure a CMOS inverter. Similarly, the second inverter 4 includes an eighth PMOS transistor P8 and an eighth NMOS transistor N8 to configure the CMOS inverter. A non-inverted output signal OUT_P is supplied to the first inverter 3 through the first node 11. Similarly, an inverted output signal OUT_N is supplied to the second inverter 4 through the second node 12.

Figure 5:
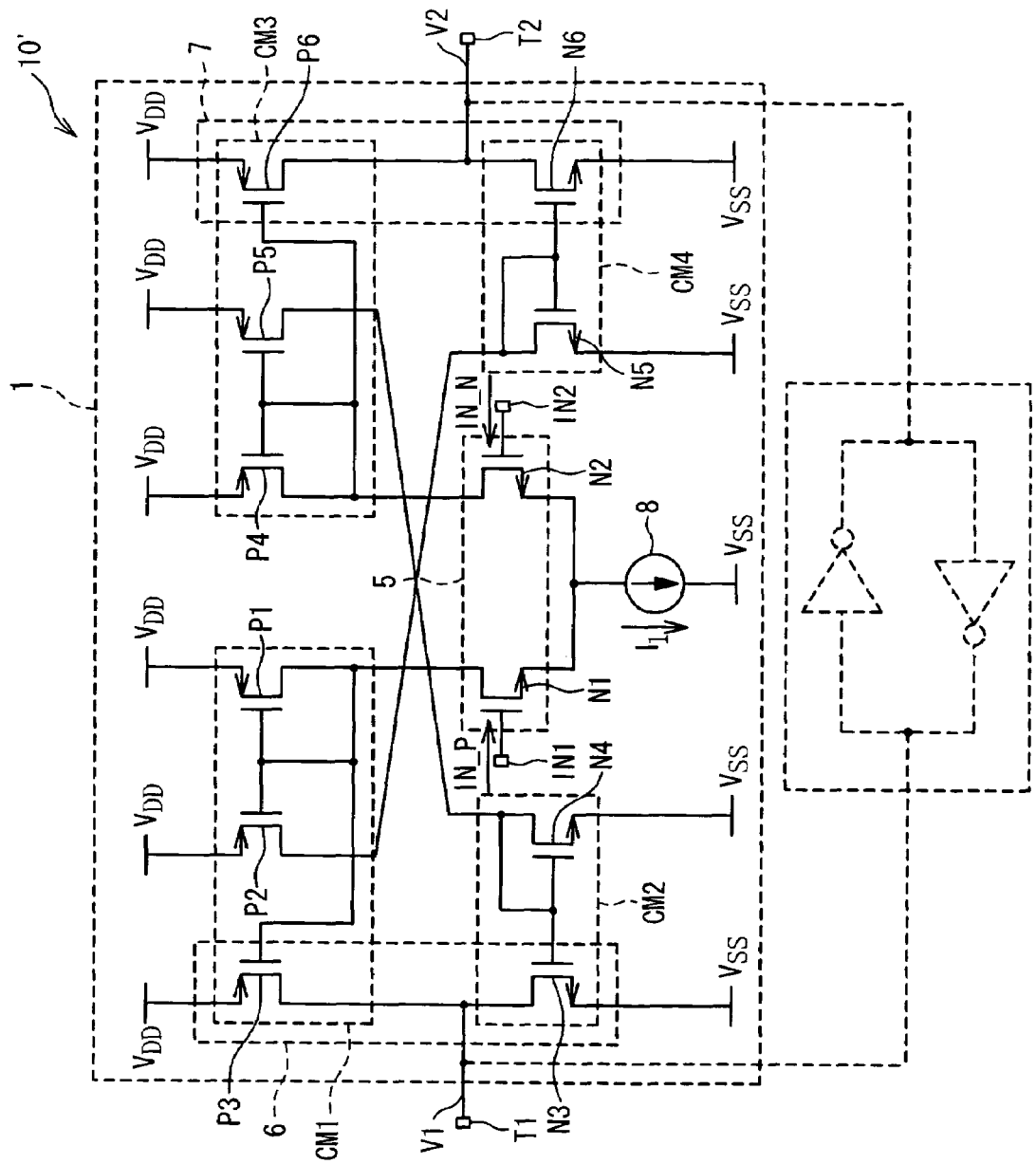
FIG. 5 is a circuit diagram showing the configuration of the phase interpolation circuit in the first embodiment when the operation is stopped.

FIG. 5 is a circuit diagram showing the configuration of the level conversion circuit 10 according to the first embodiment when the operation of the phase interpolation circuit 2 is stopped. In this case, the level conversion circuit is referred to as a level conversion circuit 10'. The level conversion circuit 10' outputs a first initial output signal V1 in response to the first differential input signal IN_P, and outputs a second initial output signal V2 in response to the second differential input signal IN_N.

Figure 6:
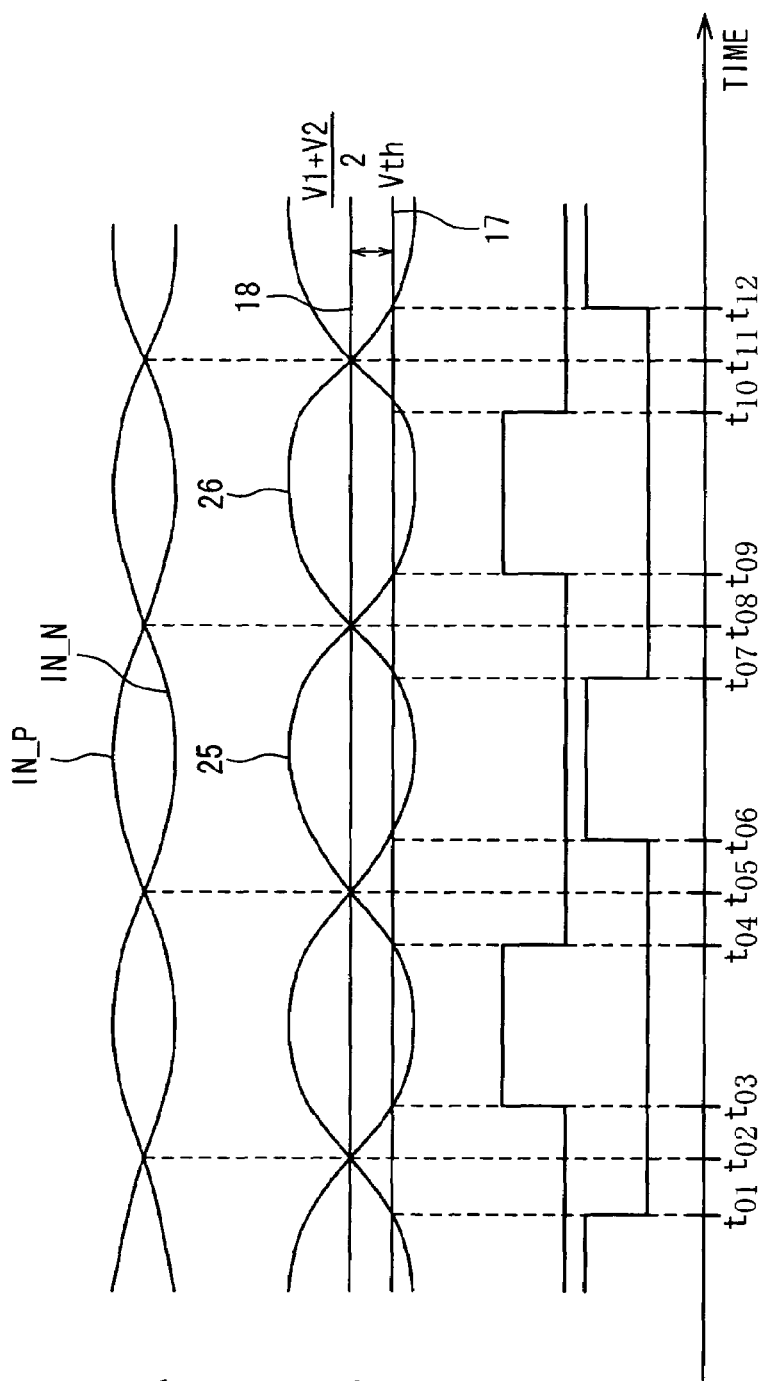
FIGS. 6A to 6C are timing charts illustrating waveforms of differential input signals, initial output signals and internal signals of a second logic level circuit block in the first embodiment.

FIG. 6A shows waveforms of the differential input signals (IN_P and IN_N) supplied to the level conversion circuit 10'. FIG. 6B shows the initial output signals (V1 and V2) that are outputted in response to the differential input signals (IN_P and IN_N). A threshold level 17 shown in FIG. 6B indicates a threshold voltage Vth of the CMOS logic level circuit block in the post stage of the level conversion circuit 10'. A waveform 18 indicates an average voltage between the first initial output signal V1 and the second initial output signal V2. FIG. 6C shows waveforms of internal signals when the initial output signals (V1 and V2) are supplied to the second logic level circuit block 22 such as a CMOS logic level circuit block that is connected to the post stage of the level conversion circuit 10'. When the level conversion is carried out to the differential input signals supplied from the first logic level circuit block 21 such as a CML logic level circuit block that is connected to the front stage of the level conversion circuit 10', there is a case that the threshold level 17 is not coincident with the waveform 18. In this case, referring to FIG. 6C, the second logic level circuit block 22 generates signals having a duty ratio different from the differential input signals (IN_P and IN_N).

Figure 7:
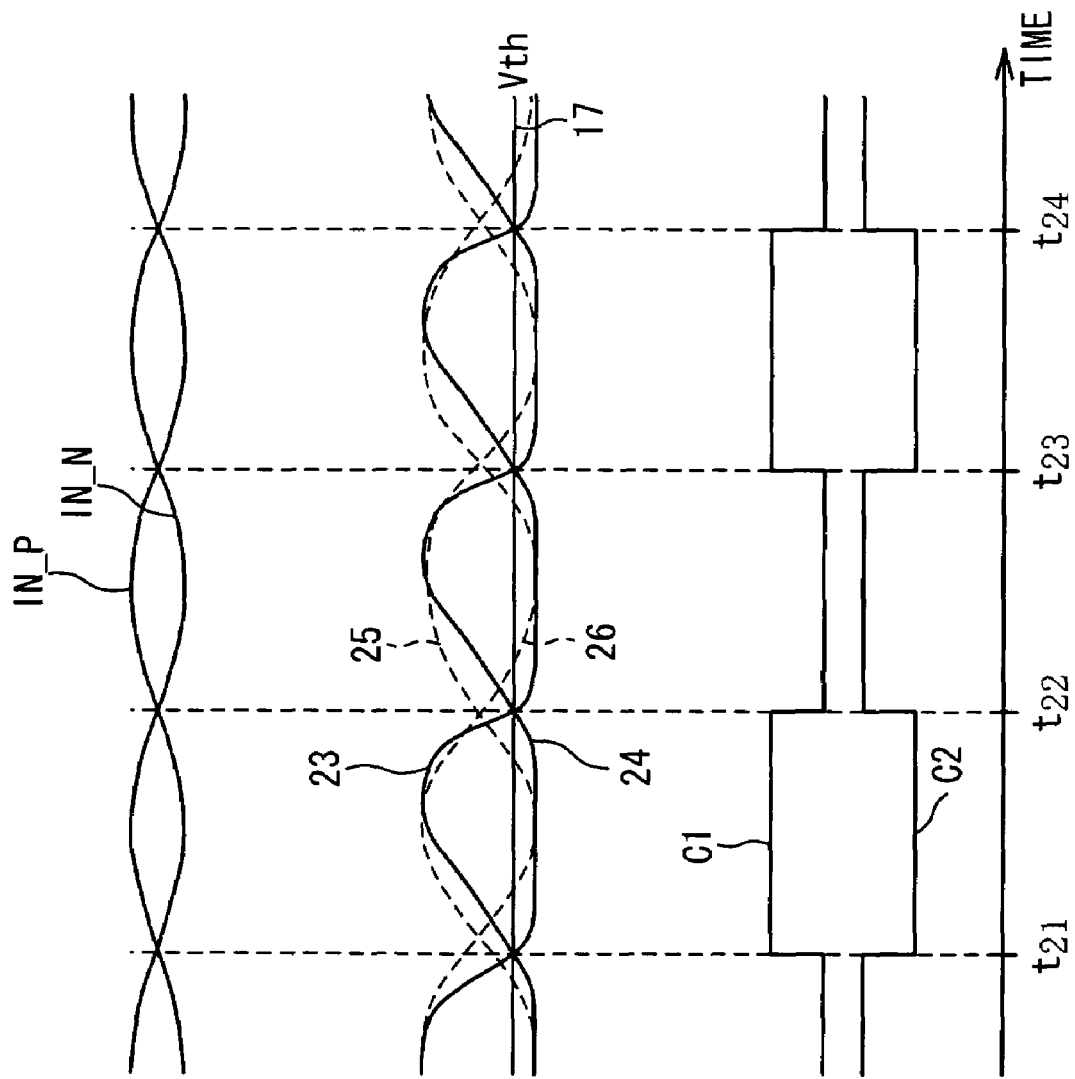
FIGS. 7A to 7C are timing charts illustrating waveforms of the differential input signals, output signals, and the internal signals of the second logic level circuit block in the first embodiment.

FIGS. 7A to 7C are timing charts illustrating respective waveforms of the differential input signals (IN_P and IN_N), the output signals (OUT_P and OUT_N) that are outputted in response to the differential input signals (IN_P and IN_N), and the internal signals of the second logic level circuit block 22 that is connected to the post stage of the level conversion circuit 10, when the phase interpolation circuit 2 is in operation in the level conversion circuit 10. FIG. 7A shows signal waveforms of the differential input signals (IN_P and IN_N). An inverted output waveform 23 in FIG. 7B is a waveform indicating a time dependency of the non-inverted output signal OUT_P that is outputted from the level conversion circuit 10 in response to the first differential input signal IN_P. Similarly, a non-inverted output waveform 24 in FIG. 7B is a waveform indicating a time dependency of the inverted output signal OUT_N that is outputted from the level conversion circuit 10 in response to the second differential input signal IN_N. FIG. 7C also shows waveforms of the internal signals of the second logic level circuit block 22 that is connected to the post stage of the level conversion circuit 10.

Referring to FIG. 7B, when the phase interpolation circuit 2 is in operation in the level conversion circuit 10, a voltage in an intersection point (hereinafter, to be referred to as a cross point) between the inverted output waveform 23 and the non-inverted output waveform 24 is coincident with the threshold voltage shown by the threshold level 17. Since the voltage in the cross point is coincident with the threshold voltage Vth, the level conversion circuit 10 carries out a level conversion in which the duty ratio of the second logic level circuit block 22 in the post stage is coincident with the duty ratio of the differential input signals (IN_P and IN_N) in the signal waveforms, as shown in FIG. 7C.

Figure 8:
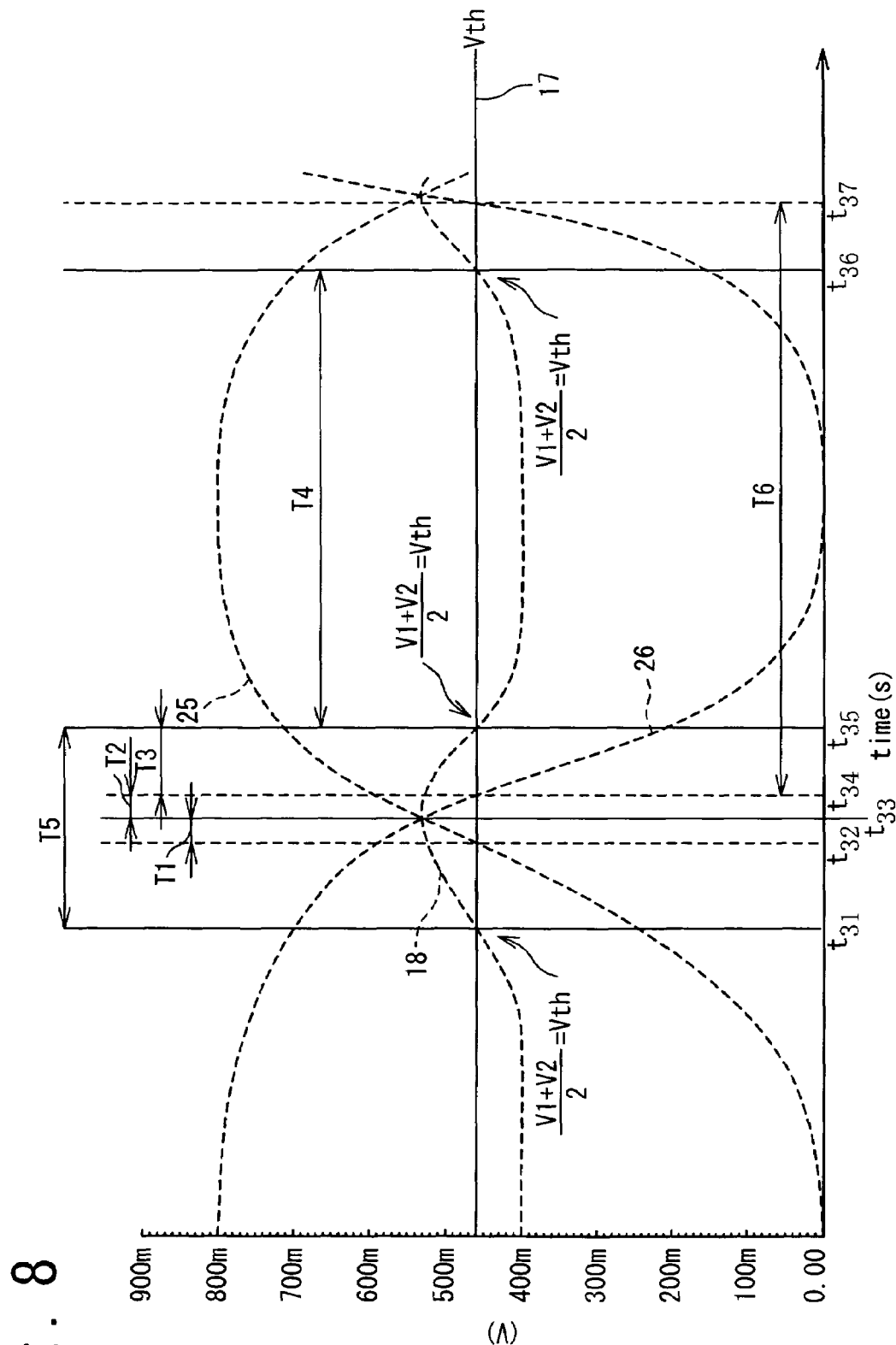
FIG. 8 is a diagram showing generation of a non-inverted output signal OUT_P and an inverted output signal OUT_N.

FIG. 8 is a diagram showing in detail generation of the non-inverted output signal OUT_P and the inverted output signal OUT_N based on the first initial output signal V1 and the second initial output signal V2. The function of the phase interpolation circuit 2 will be described below by referring to FIG. 8.

It is assumed that the first inverter 3 and the second inverter 4 in the phase interpolation circuit 2 have driving capabilities such that logical inversion is caused in response to a signal voltage outputted from the level converting section 1 of the level conversion circuit 10. Accordingly, it is assumed in the following description that logical inversion is caused by the first inverter 3 (or by the second inverter 4) when the first initial output signal V1 (the second initial output signal V2) higher than the threshold voltages of the first inverter 3 (or the second inverter 4) is supplied.

The level converting section 1 converts an input signal from a small amplitude level to a CMOS level. At this time, there is a case that the voltage in the cross point between the first initial output signal V1 and the second initial output signal V2 is not coincident with the threshold voltage Vth of the CMOS circuit of the second logic level circuit block 22. In this case, the phase interpolation circuit 2 adjusts an average voltage of inputted/outputted signals to the threshold voltages Vth of the first inverter 3 and the second inverter 4 in the phase interpolation circuit 2. Therefore, the average voltage of the output signals (OUT_P and OUT_N) of the level conversion circuit 10 is set to the threshold voltages Vth of the first inverter 3 and the second inverter 4 by connecting the phase interpolation circuit 2 to the output stages of the level converting section 1. The threshold voltages Vth of the first inverter 3 and the second inverter 4 are set to be equal to the threshold voltage Vth of the second logic level circuit block 22 that is connected to the post stage of the level conversion circuit 10. Consequently, the level conversion circuit 10 can output the output signals (OUT_P and OUT_N) in which the duty ratio of the internal signal of the second logic level circuit block 22 is equivalent to (or almost the same with) the duty ratio of the differential input signals (IN_P and IN_N).

The phase interpolation circuit 2 in the first embodiment is configured by mutually connecting the input terminal and output terminal of the two inverters 3 and 4, as described above (FIG. 4). When the voltage of the first node 11 is higher than the threshold voltage Vth on the phase interpolation circuit 2 side, the first inverter 3 pulls down the voltage of the second node 12 to the voltage of a second power source line $V_{SS}$. When the voltage of the first node 11 is lower than the threshold voltage Vth on the phase interpolation circuit side, the first inverter 3 pulls up the voltage of the second node 12 to the voltage of a first power source line $V_{DD}$. Similarly, when the voltage of the second node 12 is higher than the threshold voltage Vth on the phase interpolation circuit side, the second inverter 4 pulls down the voltage of the first node 11 to the voltage of the second power source line $V_{SS}$. When the voltage of the second node 12 is lower than the threshold voltage Vth on the phase interpolation circuit side, the second inverter 4 pulls up the voltage of the first node 11 to the voltage of the first power source line $V_{DD}$. In this case, a larger difference between the voltage of the first node 11 (or the second node 12) and the threshold voltage Vth on the phase interpolation circuit side will require a higher driving capability for the first inverter 3 (or the second inverter 4) to drive the output node 12 (or the first node 11).

FIG. 8 shows the first initial output waveform 25 and the second initial output waveform 26 in the level converting section 1 in more detail than the first initial output waveform 25 and the second initial output waveform 26 shown in FIGS. 6A to 6C when the operation of the phase interpolation circuit 2 is stopped. The threshold level 17 shows the threshold voltage Vth of the second logic level circuit block 22. The waveform 18 shows an average voltage between the first initial output signal V1 and the second initial output signal V2. Here, it is supposed that the voltage of the first initial output signal V1 at a predetermined time is regarded as a first voltage v1, and similarly the voltage of the second initial output signal V2 at a predetermined time is regarded as a second voltage v2. Also, it is supposed that the phase interpolation circuit 2 is regarded as having a threshold voltage equivalent to the threshold voltage Vth of the second logic level circuit block 22.

Also, referring to FIG. 8, an average voltage Va between the first initial output signal V1 and the second initial output signal V2 at time t31, time t35 and time t36 is expressed as follows:

Average voltage $Va$=(First voltage $v1$+ Second voltage $v2$)/2=Threshold voltage $Vth$.

Also, FIG. 8 shows:

At time t32: First voltage v1=Threshold voltage Vth;

At time t33: First voltage v1=Second voltage v2; and

At time t34: Second voltage v2=Threshold voltage Vth.

A period from the time t32 to the time t33 is set as a first period T1, a period from the time t33 to the time t34 is set as a second period T2, a period from the time t34 to the time t35 is set as a third period T3, and a period from the time t35 to the time t36 is set as a forth period T4. A period from the time t31 to the time t35 is set as a fifth period T5, and a period from the time t34 to the time t37 is set as a sixth period T6. In this case, a case is considered when the above-mentioned average voltage Va between the first initial output signal V1 and the second initial output signal V2 (Average voltage Va=(First voltage v1+Second voltage v2)/2) is not coincident with the threshold voltage Vth. At the time t31, the time t35 and the time t36, the average voltage Va is coincident with the threshold voltage Vth. Therefore, the average voltage Va is not coincident with the threshold voltage Vth at optional time other than the time t31, the time t35 and the time t36. It is assumed that the average voltage Va is not equal to the threshold voltage Vth, and a relation of First voltage v1>Second voltage v2>Threshold voltage Vth is met in the period T2 in FIG. 8.

Figure 9:
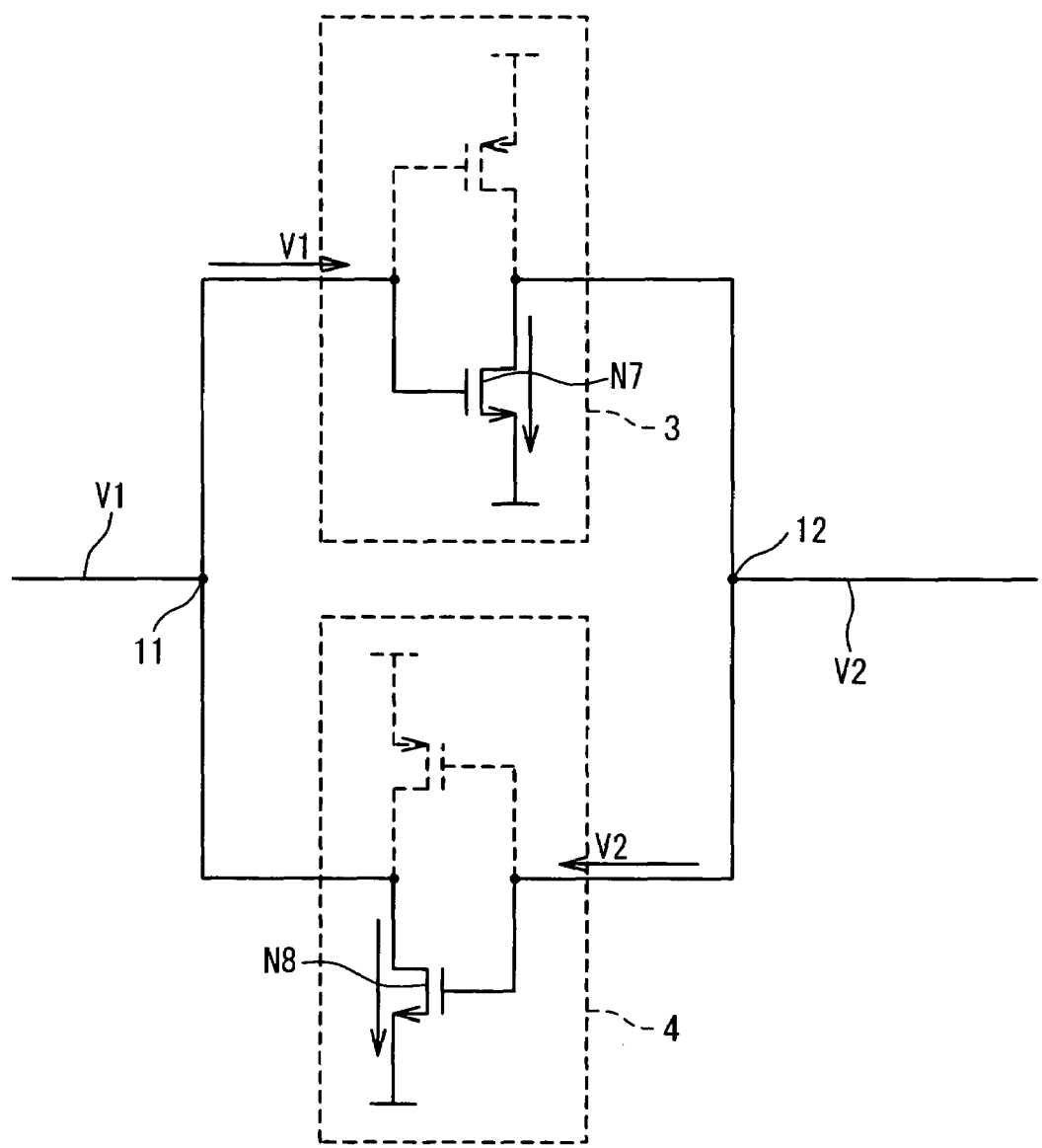
FIG. 9 is a diagram showing an operation of the phase interpolation circuit.

In this case, the first inverter 3 and the second inverter 4 pull down the outputs to the voltage of the second power source line $V_{SS}$ in response to the input signal voltages (v1 and v2), respectively (See FIG. 9). Accordingly, the first inverter 3 operates to make the second initial output signal V2 close to the threshold voltage Vth in response to the first initial output signal V1, while the second inverter 4 operates to make the first initial output signal V1 close to the threshold voltage Vth in response to the second initial output signal V2.

FIG. 9 is a diagram showing an operation of the phase interpolation circuit 2 when the above conditions are satisfied. Referring to FIG. 9, the first initial output signal V1 is supplied to the first inverter 3 of the phase interpolation circuit 2 through the first node 11. The seventh NMOS transistor N7 of the first inverter 3 is activated in response to the first initial output signal V1 to pull down the second node 12 to the second power source line $V_{SS}$. Then, the second initial output signal V2 is supplied to the second inverter 4 through the second node 12. The eighth NMOS transistor N8 of the second inverter 4 is activated in response to the second initial output signal V2 thereof to pull down the first node 11 to the second power source line $V_{SS}$. In this case, the following relation is met:

First voltage $v1$–Threshold voltage $Vth$>Second voltage $v2$–Threshold voltage Vth.

Therefore, the first inverter 3 requires a higher driving capability to pull down the second node 12 to the second power source line $V_{SS}$ than a driving capability with which the second inverter 4 pulls down the first node 11. Accordingly, the voltage of the second node 12 reaches to the threshold voltage Vth earlier than the voltage of the first node 11 to reach to the threshold voltage Vth. Therefore, the relation among the first voltage v1, the second voltage v2, and the threshold voltage Vth will vary as follows along with time passing:

From: First voltage v1>Second voltage v2>Threshold voltage Vth

To: First voltage v1>Threshold voltage Vth>Second voltage v2.

In case of First voltage v1<Threshold voltage Vth<Second voltage v2, the first inverter 3 pulls up the second node 12 to the voltage of the first power source line $V_{DD}$. Simultaneously, the second inverter 4 pulls down the first node 11 to the second power source line $V_{SS}$. At this time, if Average voltage Va>Threshold voltage Vth, the second inverter 4 requires a higher driving capability to pull down the first node 11 than a driving capability with which the first inverter 3 pulls up the second node 12. This operation will remain until:

Average voltage Va=Threshold voltage Vth. Accordingly, the phase interpolation circuit 2 operates to bring a convergence to the condition that:

Threshold value voltage $Vth$–First voltage $v1$=Second voltage $v2$–Threshold voltage $Vth$.

In addition, if the following relation is met:

Average voltage Va<Threshold voltage Vth, the first inverter 3 requires a higher driving capability to pull up the second node 12 to the first power source line $V_{DD}$ than the driving capability with which the second inverter 4 pulls down the first node 11. This operation will also remain until:

Average voltage Va=Threshold voltage Vth. Therefore, in either case, the phase interpolation circuit 2 is aimed to bring a convergence as follows:

Threshold value voltage $Vth$–First voltage $v1$=Second voltage $v2$–Threshold value voltage $Vth$.

In this way, when the first initial output signal V1 and the second initial output signal V2 are supplied to the phase interpolation circuit 2, the phase interpolation circuit 2 operates to stabilize the average voltage Va to the threshold voltage Vth. This operation does not depends on a voltage difference between the first initial output signal V1 and the second initial output signal V2 at the optional time (between the first voltage v1 and the second voltage v2) due to the symmetrical characteristics of the circuit.

Figure 10:
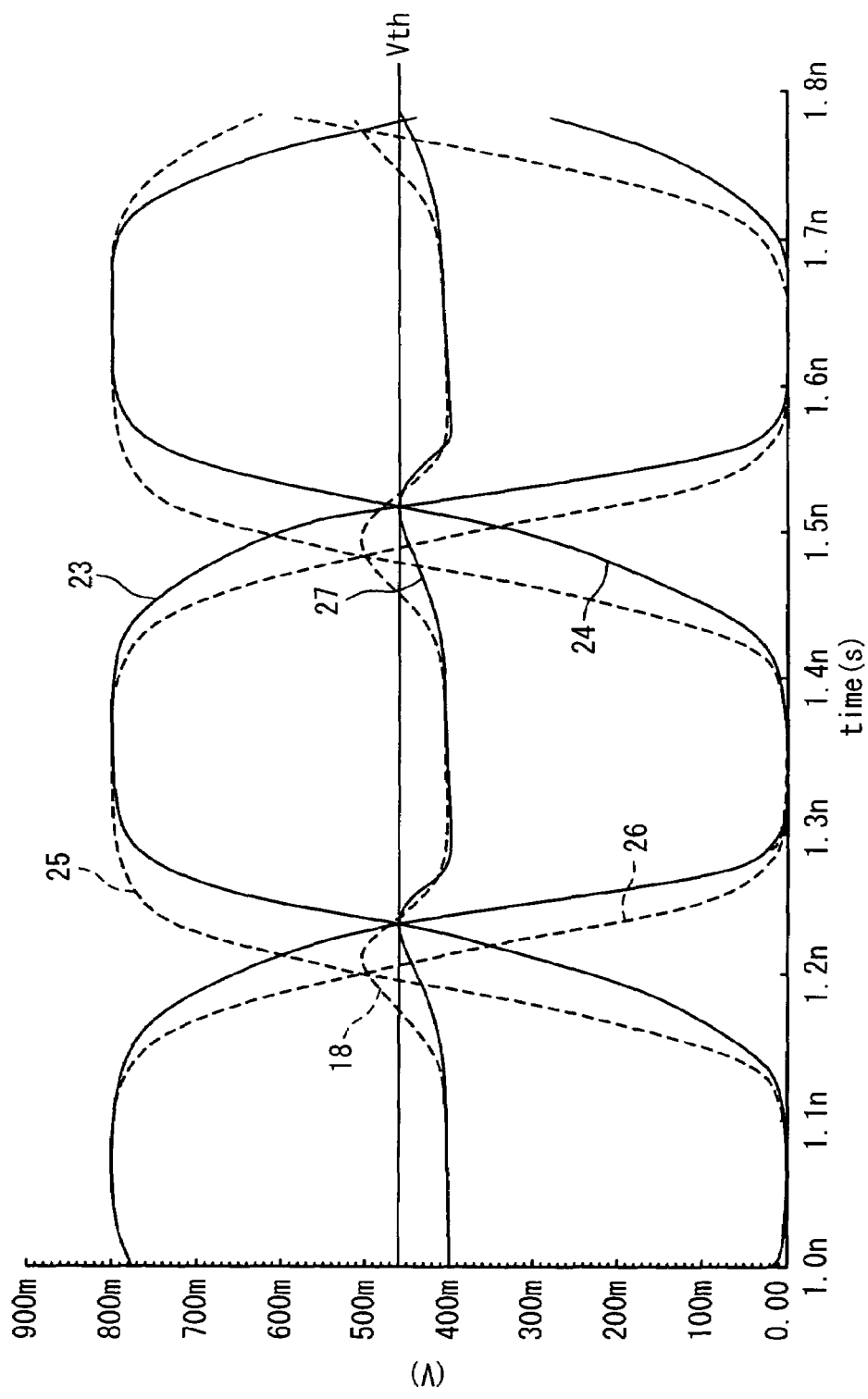
FIG. 10 is a waveform diagram showing signal waveforms of the output signals when the phase interpolation circuit is in operation.

FIG. 10 is a waveform diagram showing signal waveforms of the output signals (OUT_P and OUT_N) when the phase interpolation circuit 2 connected to the level converting section 1 is in operation. The non-inverted output waveform 23 shows a time-dependent change of a voltage on the first output terminal T1 when the phase interpolation circuit 2 is in operation. Similarly, the inverted output waveform 24 shows a time-dependent change of a voltage on the second output terminal T2 when the phase interpolation circuit 2 is in operation. Furthermore, the waveform 27 shows the average voltage of the output signals (OUT_P and OUT_N). Referring to FIG. 10, the voltage in the cross point between the non-inverted output waveform 23 and the inverted output waveform 24 (the voltage when the non-inverted output signal OUT_P is equivalent to the inverted output signal OUT_N) becomes equal to the threshold voltage Vth, compared to the waveforms (25 and 26) when the phase interpolation circuit 2 is not in operation.

Thus, the level conversion circuit 10 is configured to have the level converting section 1 and the phase interpolation circuit 2. In this case, the level conversion circuit 10 is configured such that the threshold voltage Vth of the phase interpolation circuit 2 is equivalent to the threshold voltage Vth of the second logic level circuit block 22 in the post stage of the level conversion circuit 10. Therefore, when the logic level of signals transferred from the first logic level circuit block 21 is converted to a different logic level, the level conversion circuit 10 can generate the output signals (OUT_P and OUT_N) without deterioration (or variation) of the duty ratio in the logic level after the conversion.

The above-mentioned description is provided to deal with the case when the voltage in the cross point between the first initial output waveform 25 and the second initial output waveform 26 (considered to be the cross point at the time t33 in FIG. 8) exceeds the threshold voltage Vth, but it does not restrict the threshold voltage Vth. At the time t33 in FIG. 8, for example, a case will be described below when the voltage in the cross point between the first initial output waveform 25 and the second initial output waveform 26 is lower than the threshold voltage Vth.

Figure 11:
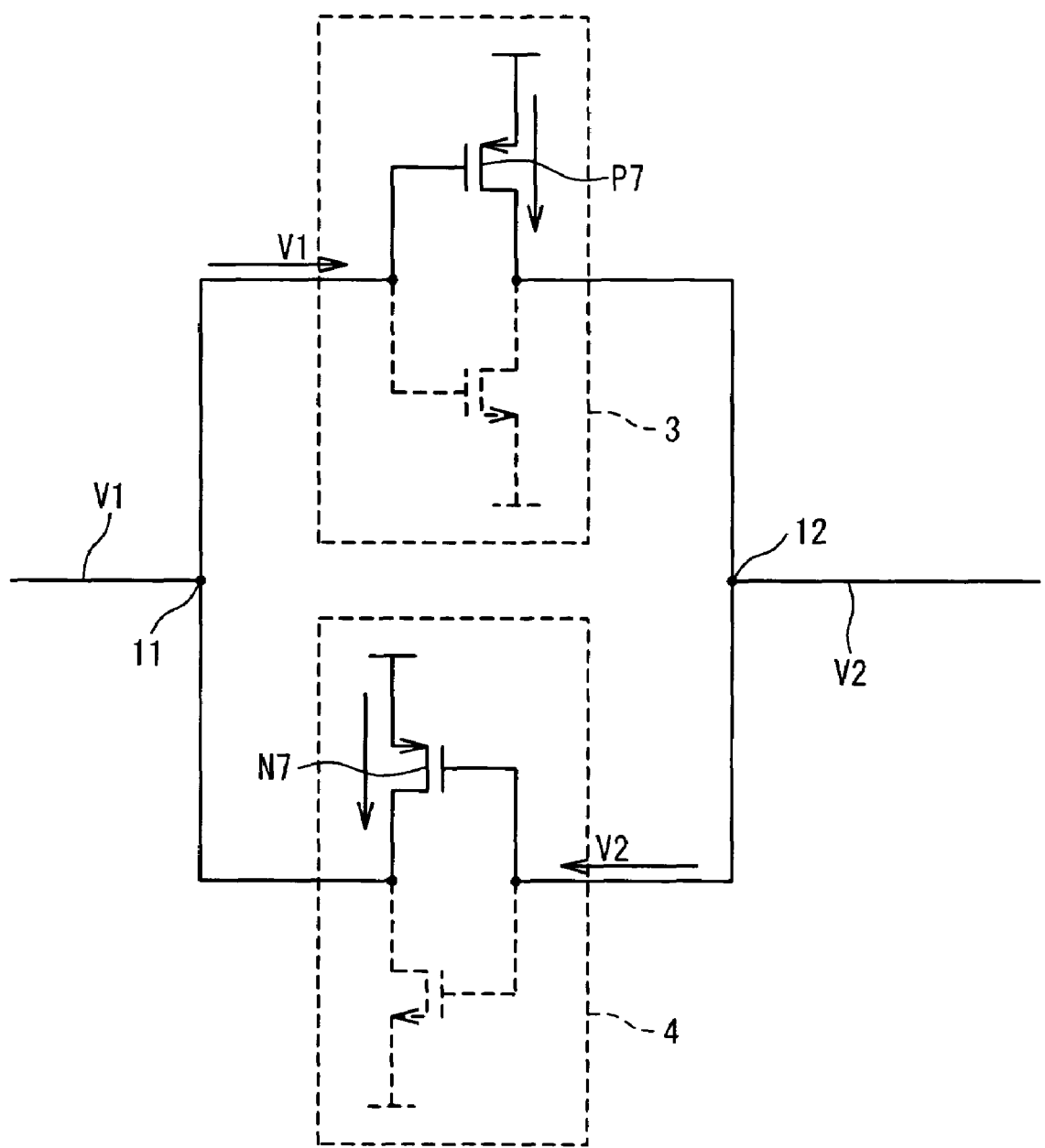
FIG. 11 is a diagram showing an operation of the phase interpolation circuit.

FIG. 11 shows the operation of the phase interpolation circuit 2 when the following equations are satisfied:

Average voltage $Va \neq$ Threshold voltage $Vth$;

and

First voltage v1<Second voltage v2<Threshold voltage Vth. At this time, the first inverter 3 and the second inverter 4 respectively pull up the outputs to the first power source line $V_{DD}$ in response to the signal voltages (v1 and v2) (See FIG. 11). Therefore, the first inverter 3 makes the second initial output signal V2 close to the threshold voltage Vth in response to the first initial output signal V1. Simultaneously, the second inverter 4 makes the first initial output signal V1 close to the threshold voltage Vth in response to the second initial output signal V2. Thus, the phase interpolation circuit 2 brings convergence as follows without depending on the threshold voltage Vth:

Threshold voltage $Vth$–First voltage $v1$=Second voltage $v2$–Threshold voltage $Vth$.

Second Embodiment

Figure 12:
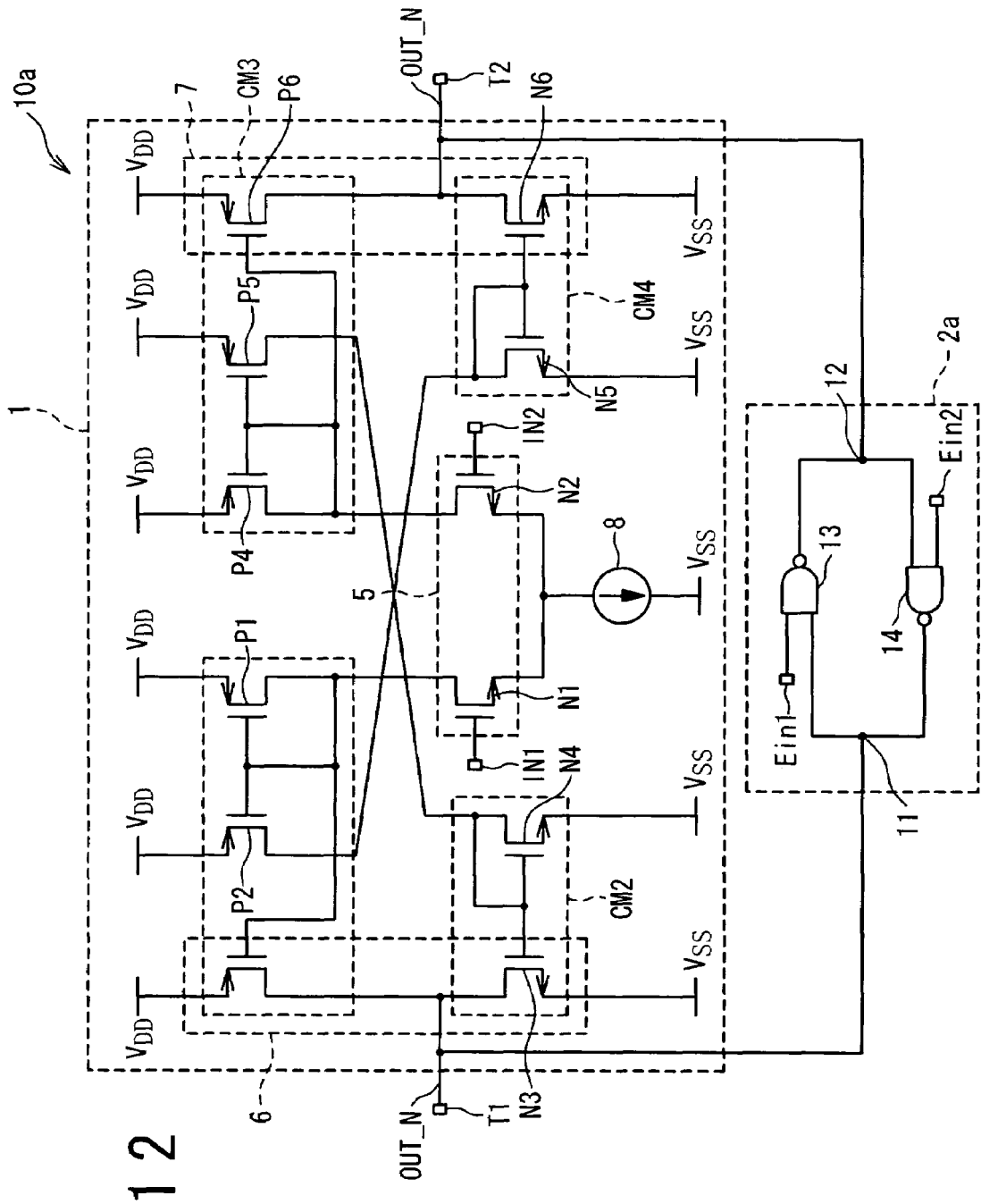
FIG. 12 is a circuit diagram showing the configuration of the level conversion circuit according to a second embodiment of the present invention.

Next, the semiconductor device with the level conversion circuit according to the second embodiment of the present invention will be described. FIG. 12 is a circuit diagram showing the configuration of the level conversion circuit 10a according to the second embodiment of the present invention. Referring to FIG. 12, the level conversion circuit 10a in the second embodiment includes the level converting section 1 and a phase interpolation circuit 2a. The phase interpolation circuit 2a in the second embodiment is different from the phase interpolation circuit 2 of the first embodiment which includes a plurality of the inverters (3, 4). The phase interpolation circuit 2a in the second embodiment includes a first NAND circuit 13 and a second NAND circuit 14. The level converting section 1 in the second embodiment has the same configuration as the level converting section 1 of the first embodiment. Accordingly, a detailed description of the level converting section 1 is omitted.

As mentioned above, the phase interpolation circuit 2a is configured of the first NAND circuit 13 and the second NAND circuit 14. Referring to FIG. 12, an output end of the first NAND circuit 13 is connected to a first input end of the second NAND circuit 14 through the second node 12. A second input end of the first NAND circuit 13 is connected to a terminal Ein1. As shown in FIG. 12, an output of the second NAND circuit 14 is connected to a first input end of the first NAND circuit 13 through the first node 11. A second input end of the second NAND circuit 14 is connected to a terminal Ein2. The phase interpolation circuit 2a receives a control signal supplied from a control circuit (not shown) by the control signal input terminal Ein1 and the control signal input terminal Ein2. An operation to phase adjustment in the phase interpolation circuit 2a is controlled in response to the control signal.

Figure 13:
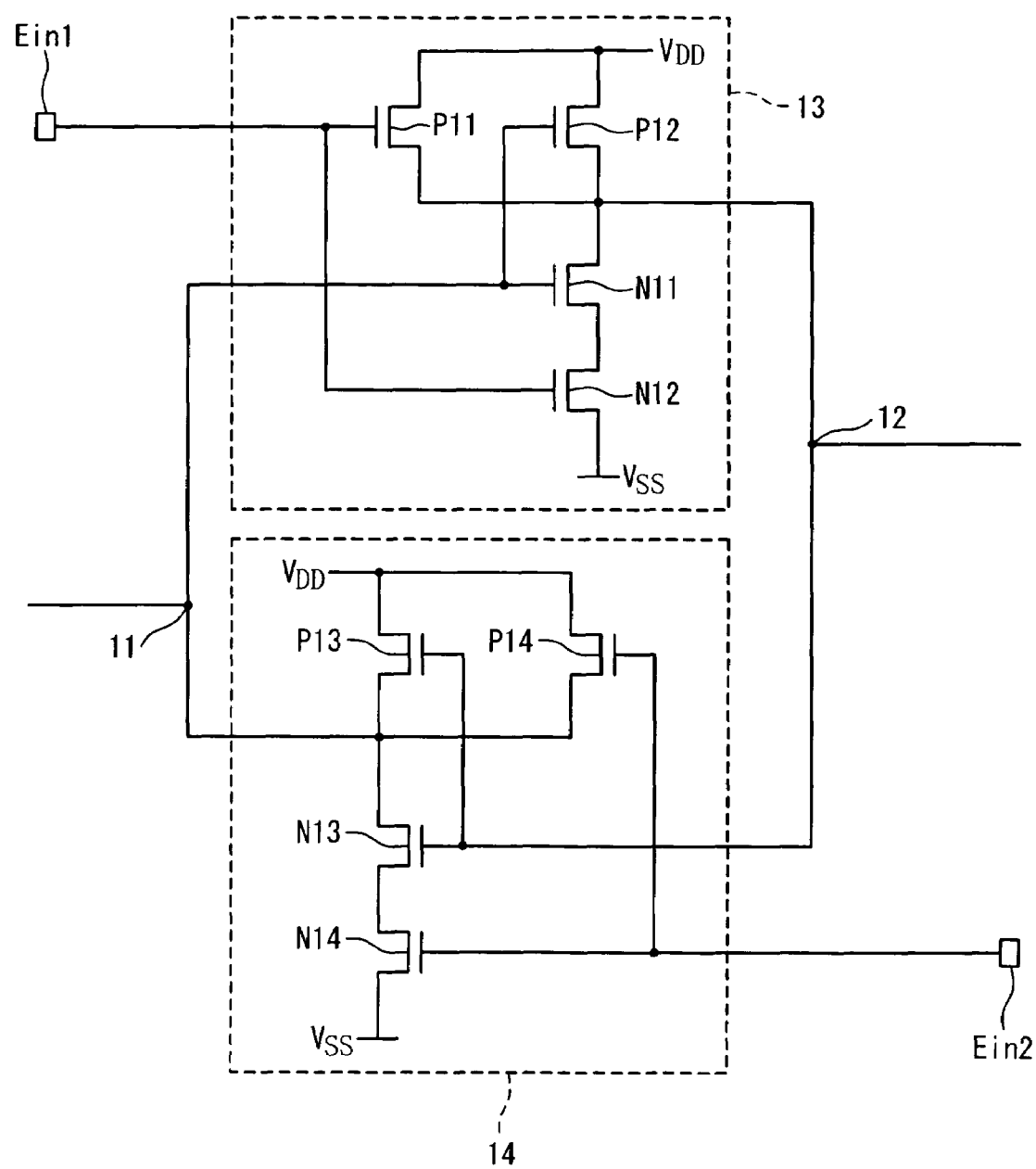
FIG. 13 is a circuit diagram showing the configuration of the phase interpolation circuit in the second embodiment.

FIG. 13 shows an example of a detailed configuration of the phase interpolation circuit 2a. Referring to FIG. 13, the first NAND circuit 13 of the phase interpolation circuit 2a includes a ninth PMOS transistor P11, a tenth PMOS transistor P12, a ninth NMOS transistor N11, and a tenth NMOS transistor N12. The second NAND circuit 14 includes an eleventh PMOS transistor P13, a twelfth PMOS transistor P14, an eleventh NMOS transistor N13, and a twelfth NMOS transistor N14. As shown in FIG. 13, a gate of the ninth PMOS transistor P11 is mutually connected to a gate of the tenth NMOS transistor N12 in the first NAND circuit 13, and a control signal supplied form the control signal input terminal Ein1 is applied. Similarly, a gate of the twelfth PMOS transistor P14 is mutually connected to a gate of the twelfth NMOS transistor N14 in the second NAND circuit 14, and a control signal supplied from the control signal input terminal Ein2 is applied.

The phase interpolation circuit 2a controls an operation of the ninth PMOS transistor P11 and the tenth NMOS transistor N12 in response to the control signal supplied from the control signal input terminal Ein1. In addition, the phase interpolation circuit 2a controls an operation of the twelfth PMOS transistor P14 and the twelfth NMOS transistor N14 in response to the control signal supplied from the control signal input terminal Ein2. When the first control signal of a low level is supplied as a control signal, for example, the first NAND circuit 13 activates the ninth PMOS transistor P11 and inactivates the tenth NMOS transistor N12 simultaneously, in response to the first control signal. Also, the second NAND circuit 14 activates the second NAND circuit 14 and inactivates the twelfth PMOS transistor P14 simultaneously in response to the control signal. In this way, the phase interpolation circuit 2a is configured of the first NAND circuit 13 and the second NAND circuit 14 and can output signals of constant levels to the first node 11 and the second node 12.

As described above, the phase interpolation circuit 2a in the second embodiment includes the first NAND circuit 13 and the second NAND circuit 14 provided with the control signal input terminals (Ein1 and Ein2). In the second embodiment, the input terminals of the first NAND circuit 13 and the second NAND circuit 14 may be short-circuited and connected to the level conversion circuit 10a. In other words, the two input terminals of the first NAND circuit are connected to the first node 11, and the two input terminals of the second NAND circuit are connected to the second node 12. These connections in the level conversion circuit 10a of the second embodiment will exhibit the effectiveness described in the first embodiment. The above description is provided to deal with the case when the phase interpolation circuit 2a according to the second embodiment is configured of the first NAND circuit 13 and the second NAND circuit 14. An NOR circuit or the like may also be employed for replacing these NAND circuits.

Third Embodiment

Figure 14:
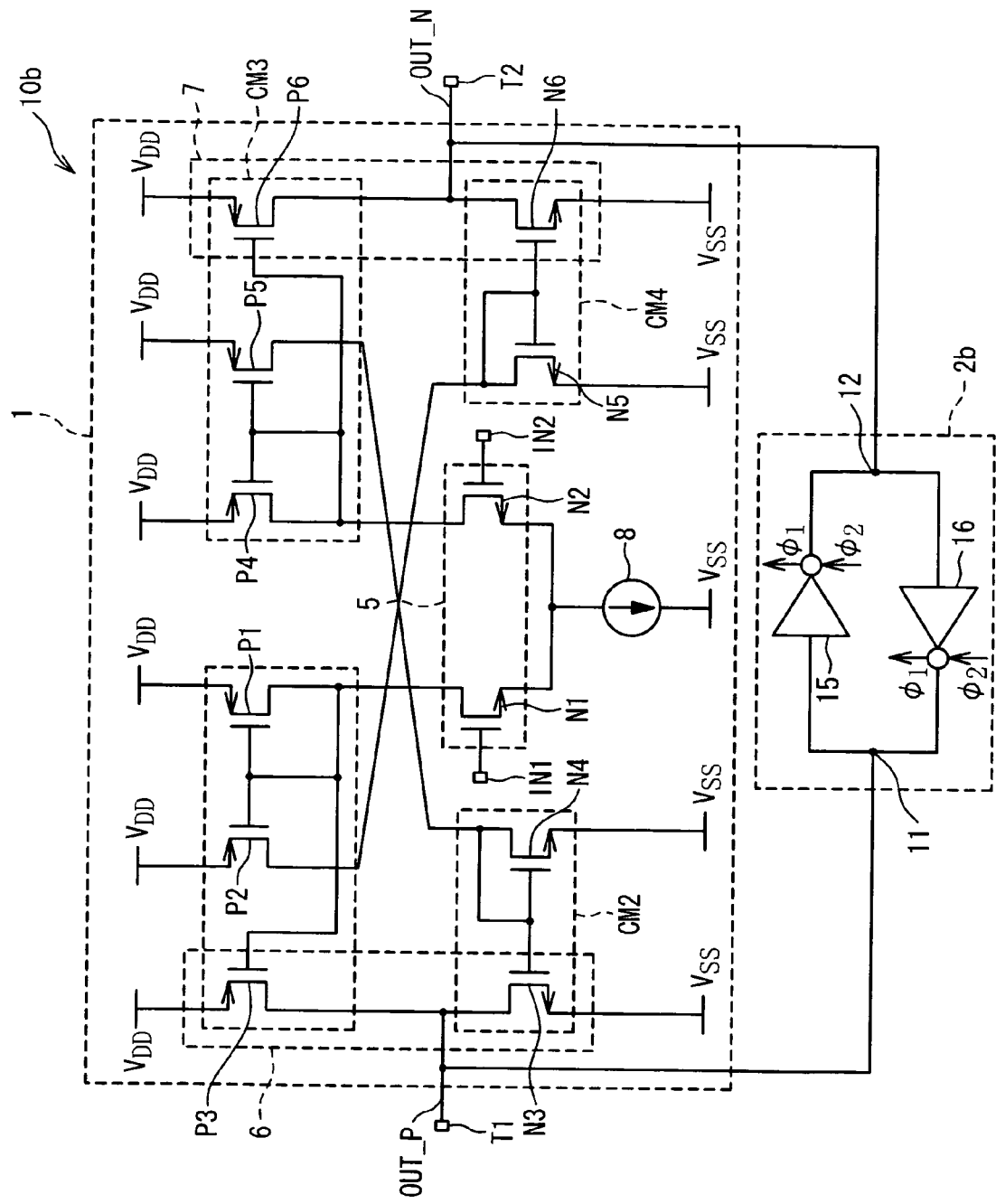
FIG. 14 is a circuit diagram showing the configuration of the level conversion circuit according to a third embodiment of the present invention.

Next, the level shift circuit according to the third embodiment of the present invention will be described below. FIG. 14 is a circuit diagram showing the configuration of the level conversion circuit 10b according to the third embodiment of the present invention. Referring to FIG. 14, the level conversion circuit 10b in the third embodiment includes the level converting section 1 and a phase interpolation circuit 2b. The phase interpolation circuit 2b in the third embodiment includes a first clocked inverter 15 and a second clocked inverter 16 which are different from the two inverters (3 and 4) in the phase interpolation circuit 2 of the first embodiment. The level converting section 1 in the third embodiment has the same configuration as the level converting circuits 1 in the first and second embodiments. Accordingly, in a detailed description of the level converting section 1 is omitted.

Referring to FIG. 14, an output of the first clocked inverter 15 of the phase interpolation circuit 2b is connected to an input of the second clocked inverter 16 through the second node 12. An output of the second clocked inverter 16 is connected to an input of the first clocked inverter 15 through the first node 11. Also, the output of the second clocked inverter 16 is connected to a first output terminal T1 through the first node 11, and the output of the first clocked inverter 15 is connected to a second output terminal T2 through the second node 12. Control signals supplied from a control circuit (not shown) are applied to the first clocked inverter 15 and the second clocked inverter 16 in the phase interpolation circuit 2b. The phase interpolation circuit 2b controls an operation of the first clocked inverter 15 and the second clocked inverter 16 in response to the control signals, so that a desired signal is supplied to the first node 11 and the second node 12.

Figure 15:
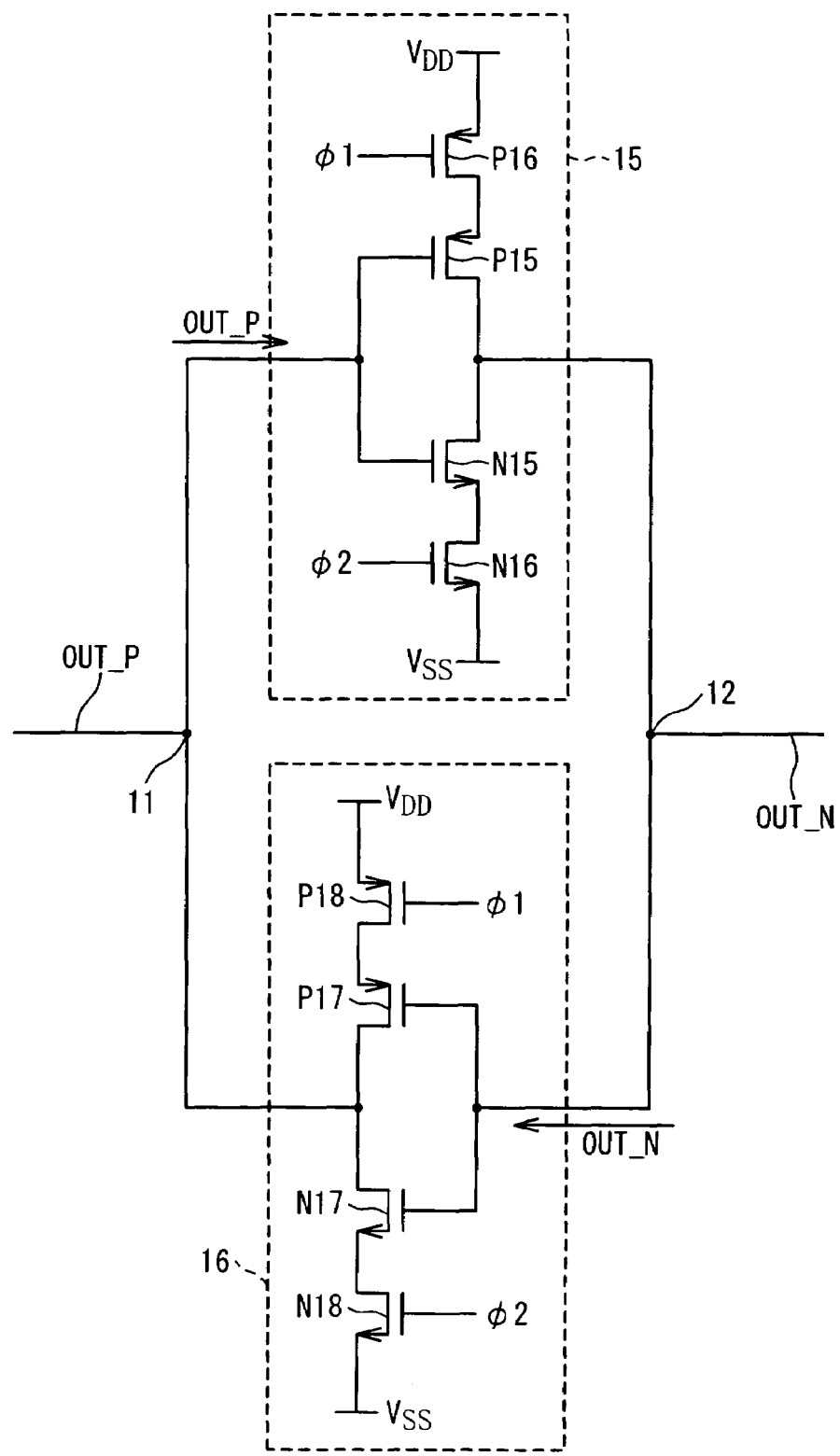
FIG. 15 is a circuit diagram showing the configuration of the phase interpolation circuit in the third embodiment.

FIG. 15 shows a detailed configuration of the phase interpolation circuit 2b. Referring to FIG. 15, the first clocked inverter 15 of the phase interpolation circuit 2b includes a thirteenth PMOS transistor P15, a fourteenth PMOS transistor P16, a thirteenth NMOS transistor N15, and a fourteenth NMOS transistor N16. Also, the fourteenth PMOS transistor P16 is connected to the thirteenth PMOS transistor P15 and a power source line $V_{DD}$. The fourteenth NMOS transistor N16 is connected between the thirteenth NMOS transistor N15 and a second power source line $V_{SS}$. A gate of the fourteenth PMOS transistor P16 and a gate of a sixteenth PMOS transistor P18 are connected to the control circuit (not shown), and an inverter control signal φ1 is supplied from the control circuit. Similarly, a gate of the fourteenth NMOS transistor N16 and a gate of a sixteenth NMOS transistor N18 are connected to the above control circuit. An inverter control signal p2 is supplied from the control circuit to the gates.

The first clocked inverter 15 controls the operation in response to the control signals (φ1 and φ2) outputted from the control circuit, and similarly, the second clocked inverter 16 controls the operation in response to the control signals (φ1 and φ2). The phase interpolation circuit 2b is configured of the first clocked inverter 15 and the second clocked inverter 16 so that the level conversion circuit 10b may stop the operation of the phase interpolation circuit 2b in response to the control signals (φ1 and φ2)

Fourth Embodiment

Figure 16:
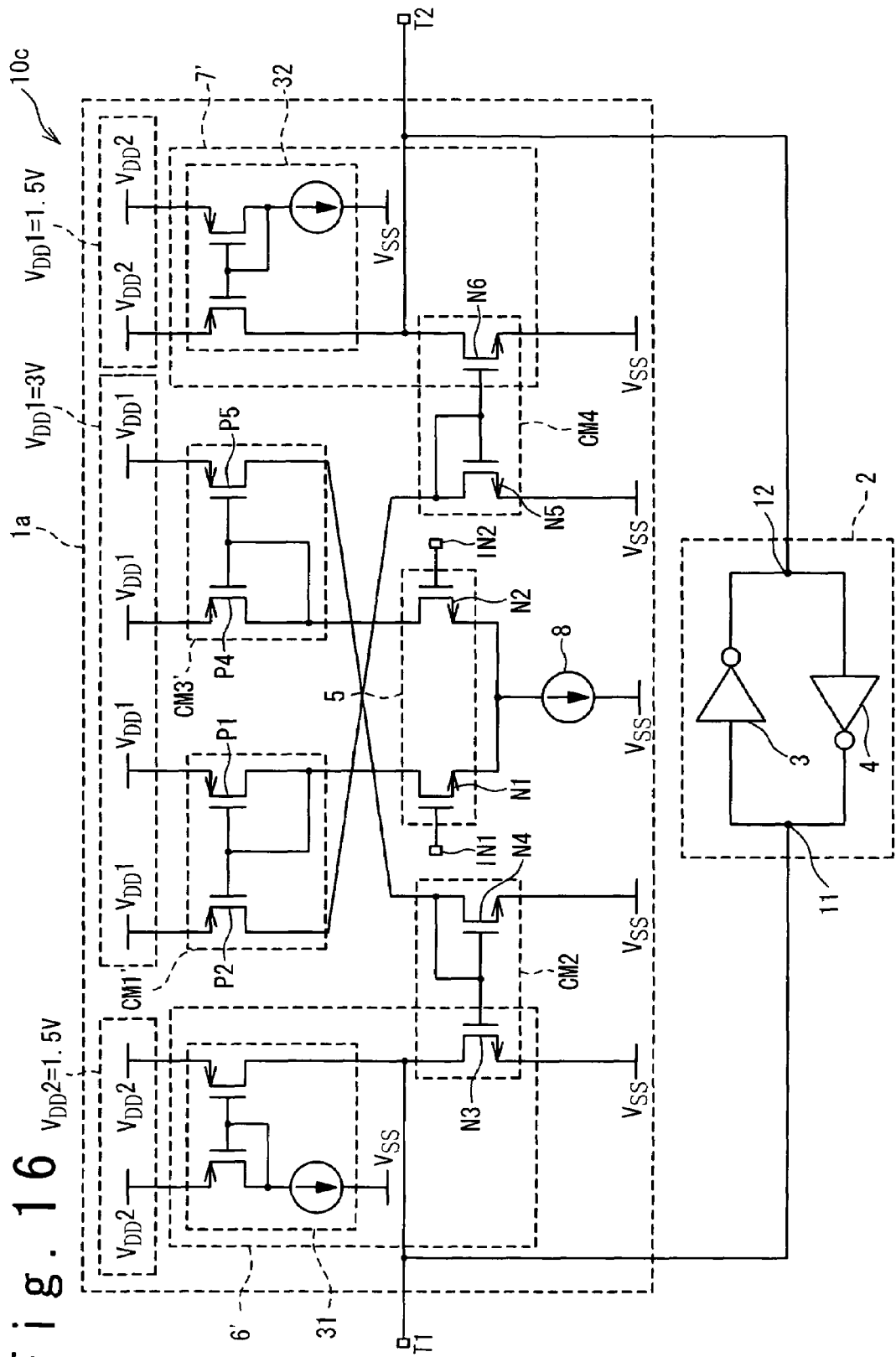
FIG. 16 is a circuit diagram showing the configuration of the level conversion circuit according to a forth embodiment of the present invention.

Next, the level conversion circuit according to the forth embodiment of the present invention will be described below. FIG. 16 is a circuit diagram showing the configuration of the level conversion circuit 10c according to the forth embodiment. Referring to FIG. 16, the level conversion circuit 10c according to the forth embodiment includes a level converting section 1a and the phase interpolation circuit 2. The level conversion circuit 10c according to the forth embodiment includes a fifth current mirror circuit CM1' connected to the first NMOS transistor N1, a sixth current mirror circuit CM3' connected to the second NMOS transistor N2, an output stage 6' having a first current supply section 31, and an output stage 7' having a second current supply section 32. The first current supply section 31 and the second electric current supply section 32 include current mirror circuits configured of the PMOS transistors, and a constant current source is supplied and a mirror current is outputted to output terminals T1 and T2.

Referring to FIG. 16, a third power source line $V_{DD}1$ in the fifth current mirror circuit CM1' and the sixth current mirror circuit CM3' is connected to a power source for supplying the voltage of 3V in the forth embodiment. A forth power source line $V_{DD}2$ of the output stages (6' and 7') is connected to a power source for supplying the voltage of 1.5V. A power source voltage of the output stage (6' and 7') is set to be different from a power source voltage of the current mirror circuits (CM1' and CM2'), so that the level conversion circuit to perform a variable level conversion can be configured.

The phase interpolation circuit 2 in the forth embodiment can be configured in the same way with the phase interpolation circuit 2a of the second embodiment or the phase interpolation circuit 2b of the third embodiment. The above embodiments can be carried out in combination as long as there is no contradiction. Also, the respective embodiments show that the paired differential transistors of the input stages 5 of the level converters 1 and 1a are configured of the NMOS transistors N1 and N2, but PMOS transistors can be employed in configuration. In this case, respective current mirror circuits can employ the PMOS transistors in place of the NMOS transistors, or the NMOS transistors in place of the PMOS transistors.

The present invention makes it possible to appropriately convert the logic level of inputted signals to the different logic level. Therefore, when a differential clock signal of a CML logic level is converted to a CMOS logic level without duty ratio deterioration, for example, a timing margin decrease caused by the duty deterioration can be suppressed in a synchronous circuit such as a flip-flop that uses both edges of a clock for the rising and falling. In other word, when a duty ratio is not 50%, it is expressed as follows:

Timing of both edges of a clock<Clock cycle/2.

This means that a timing margin is reduced in accordance with the duty deterioration in the synchronous circuit. Accordingly, when a level conversion circuit according to the present invention is installed in semiconductor devices requiring the level conversion, the duty deterioration is caused only by a relative accuracy variation and a variation of the duty ratio is not caused by a device variation or the like. Consequently, a maximum timing margin can be secured.

What is claimed is:

1. A level conversion circuit comprising:
    differential pair transistors configured to receive differential input signals; and
    a current mirror section connected to outputs of said differential pair transistors and configured to output mirror currents to differential output terminals,
    wherein said differential pair transistors have first and second transistors, and said current mirror section comprises:
        a first current mirror circuit configured to receive output current from said first transistor to output a first mirror current as one of the mirror currents;
        a second current mirror circuit configured to receive output current of said second transistor to output a second mirror current as another of the mirror currents;
        a third current mirror circuit configured to receive said second mirror current to output a third mirror current to a first output terminal of said differential output terminals; and
        a fourth current mirror circuit configured to receive said first mirror current to output a fourth mirror current to a second output terminal of said differential output terminals.

2. The level conversion circuit according to claim 1, further comprising first and second inverters cross-coupled to each other between said differential output terminals.

3. The level conversion circuit according to claim 1, wherein said first current mirror circuit outputs a fifth mirror current to said first output terminal, and said second current mirror circuit outputs a sixth mirror current to said second output terminal.

4. The level conversion circuit according to claim 1, further comprising:
a fifth current mirror circuit configured to receive a constant current to output a seventh mirror current to said first output terminal, and
a sixth current mirror circuit configured to receive a constant current to output an eighth mirror current to said second output terminal.

5. The level conversion circuit according to claim 4, wherein said differential pair transistors, and said third and fourth current mirror circuits comprise NMOS transistors, and
said first, second, fifth and sixth current mirror circuits comprise NMOS transistors.

6. The level conversion circuit according to claim 4, wherein said differential pair transistors, and said third and fourth current mirror circuits comprise NMOS transistors, and
said first, second, fifth and sixth current mirror circuits comprise PMOS transistors.

7. The level conversion circuit according to claim 4, wherein a power supply to which sources of transistors of said first and second current mirror circuits are connected supplies a voltage different from a voltage supplied from a power supply to which sources of transistors of said fifth and sixth current mirror circuits.

8. The level conversion circuit according to claim 1, wherein said first transistor receives a non-inversion input signal, and said second transistor receives an inversion input signal, and
the non-inversion output signal is outputted from said first output terminal and an inversion output signal is outputted from said second output terminal.

9. The level conversion circuit according to claim 1, wherein said differential pair transistors, and said third and fourth current mirror circuits comprise NMOS transistors, and
said first and second current mirror circuits comprise PMOS transistors.

10. The level conversion circuit according to claim 1, wherein said differential pair transistors, and said third and fourth current mirror circuits comprise PMOS transistors, and
said first and second current mirror circuits comprise NMOS transistors.

11. The level conversion circuit according to claim 1, wherein said first inverter is a first CMOS inverter having an input terminal connected with said first output terminal and an output terminal connected with said second output terminal, and
said second inverter is a second CMOS inverter having an input terminal connected with said second output terminal and an output terminal connected with said first output terminal.

12. The level conversion circuit according to claim 1, wherein said first inverter is a first CMOS NAND circuit having an input terminal connected with said first output terminal and an output terminal connected with said second output terminal, and
said second inverter is a second CMOS NAND circuit having an input terminal connected with said second output terminal and an output terminal connected with said first output terminal.

13. The level conversion circuit according to claim 1, wherein said first inverter is a first CMOS clocked inverter having an input terminal connected with said first output terminal and an output terminal connected with said second output terminal, and
said second inverter is a second CMOS clocked inverter having an input terminal connected with said second output terminal and an output terminal connected with said first output terminal.

14. The level conversion circuit according to claim 1, wherein said current mirror section comprises a plurality of interconnected current mirrors.

15. The level conversion circuit according to claim 14, wherein said current mirror section comprises:
a first plurality of interconnected current mirrors to provide output mirror current to a first differential output terminal; and
a second plurality of interconnected current mirrors to provide output mirror current to a second differential output terminal.

16. A level conversion circuit comprising:
a first differential transistor having a gate receiving a first input signal of a differential input signal;
a second differential transistor having a gate receiving a second input signal of said differential input signal;
a constant current source connected to sources of said first differential transistor and said second differential transistor;
a first current mirror connected to a drain of said first differential transistor to provide a current to a first differential output terminal node;
a second current mirror connected to a drain of said second differential transistor to provide a current to a second differential output terminal node;
a third current mirror, controlled by said first current mirror, to provide a current to said second differential output terminal node; and
a fourth current mirror, controlled by said second current mirror, to provide a current to said first differential output terminal node.

17. The level conversion circuit according to claim 16, further comprising:
first and second inverters cross-coupled to each other between said first and second differential output terminal nodes.

* * * * *